(12) United States Patent
Liffran

(10) Patent No.: US 10,742,126 B2
(45) Date of Patent: Aug. 11, 2020

(54) TRANSFORMATION DEVICE COMPRISING A TRANSFORMER AND ELECTRICAL COMPONENTS

(71) Applicant: BRIGHTLOOP, Paris (FR)

(72) Inventor: Florent Liffran, Paris (FR)

(73) Assignee: BRIGHTLOOP, Paris (FR)

( * ) Notice: Subject to any disclaimer, the term of this patent is extended or adjusted under 35 U.S.C. 154(b) by 0 days.

(21) Appl. No.: 16/593,597

(22) Filed: Oct. 4, 2019

(65) Prior Publication Data
US 2020/0112259 A1   Apr. 9, 2020

(30) Foreign Application Priority Data

Oct. 5, 2018 (FR) ...................................... 18 59267

(51) Int. Cl.
H02M 7/00 (2006.01)
H02M 3/335 (2006.01)
H01F 27/29 (2006.01)

(52) U.S. Cl.
CPC ........ H02M 3/33576 (2013.01); H01F 27/29 (2013.01); H02M 7/003 (2013.01)

(58) Field of Classification Search
CPC .................................................... H02M 7/003
USPC .............................................. 363/21.01, 147
See application file for complete search history.

(56) References Cited

U.S. PATENT DOCUMENTS

| 5,126,714 | A | * | 6/1992 | Johnson | ................. | H01F 19/04 336/183 |
| 6,420,953 | B1 | * | 7/2002 | Dadafshar | ............. | H01F 27/027 336/200 |
| 2006/0152318 | A1 | | 7/2006 | Isurin et al. | | |
| 2008/0231403 | A1 | * | 9/2008 | Hsu | ..................... | H01F 27/2804 336/180 |
| 2009/0085702 | A1 | | 4/2009 | Zeng et al. | | |
| 2009/0309684 | A1 | | 12/2009 | Tsai et al. | | |
| 2016/0197557 | A1 | | 7/2016 | Namba et al. | | |
| 2017/0141695 | A1 | * | 5/2017 | Zeng | ........................ | H01F 27/40 |
| 2018/0069485 | A1 | | 3/2018 | Hsiao et al. | | |
| 2018/0138801 | A1 | | 5/2018 | Chen | | |
| 2018/0182527 | A1 | | 6/2018 | Fujita | | |

\* cited by examiner

*Primary Examiner* — Gary A Nash
(74) *Attorney, Agent, or Firm* — Muncy, Geissler, Olds & Lowe, P.C.

(57) ABSTRACT

Transformation device including a transformer, first electrical components and connections, the transformer including a first winding and a second winding, the first electrical components being connected via the connections between first terminals of the first winding, the first electrical components extending over an integration surface situated between the connections, the integration surface, the connections and a portion of the first winding forming portions of circulation of a first current circulation loop, the transformation device being arranged for a connection current to circulate in the first current circulation loop, each portion of circulation being wider than it is long in the line of circulation of the connection current.

12 Claims, 4 Drawing Sheets

TRANSFORMATION DEVICE COMPRISING A TRANSFORMER AND ELECTRICAL COMPONENTS

The invention relates to the field of transformation devices comprising a transformer and electrical components.

BACKGROUND OF THE INVENTION

A switched-mode power supply forming a DC/DC converter conventionally comprises a high-frequency transformer making it possible to produce galvanic insulation and apply a transformation ratio to the voltage and the current. The transformer comprises windings forming at least one primary coil and at least one secondary coil, and a magnetic circuit allowing them to be coupled.

In addition to safety and reliability, the designers of a switched-mode power supply seek to optimize, on the one hand, the conversion efficiency, and, on the other hand, the power density.

These two objectives are however linked by the fact that, while a high efficiency makes it possible to reduce the energy consumption for a given output power, it above all makes it possible to reduce the losses generated and therefore the volume and the weight of the cooling means necessary to limiting overheating. Obtaining a high efficiency is therefore an important asset in optimizing the power density of the switched-mode power supply.

The main variable influencing the compactness of the switched-mode power supply is its switching frequency. The use of a high switching frequency tends to reduce the energy stored in the reactive elements, inductors and capacitors, and thereby reduce the volume thereof.

However, a high switching frequency has a negative impact on efficiency because of the switching losses in the switching components (transistors, diodes), which are proportional to that frequency, and on the level of losses in general. The level of losses is in fact increased because of the increase, at high frequency, in the relative significance of stray capacitances, and the increase in the electrical resistance of the conductors. The increase in the electrical resistance of a conductor passed through by a high-frequency current is due to the "skin" and "proximity" effects.

The skin effect results from the fact that a conductor, passed through by an alternating current, generates a magnetic field which, by feedback, tends to create a current neutralizing the initial current, with the consequence of "driving" the alternating current into the periphery of the conductor. Thus, the higher the switching frequency, the lower the current density at the centre of the conductor, which increases the equivalent electrical resistance. This effect exists also between two adjacent conductors, when the magnetic field created by the current in one conductor affects the distribution of the current in the second: this is then called proximity effect.

The impact of the skin and proximity effects in the transformer of a switched-mode power supply is highly detrimental.

When wanting to increase the power and therefore the current supplied by a switched-mode power supply without penalizing the efficiency thereof, the section of the conductors should be increased to reduce their electrical resistance. However, at high frequency, the current does not penetrate into the core of the conductors because of the skin and proximity effects, and the increase in the section of the conductors is ineffective.

It is therefore understood that it is complicated to increase the power supplied by a switched-mode power supply while conserving the efficiency and the compactness thereof.

To mitigate the skin and proximity effects, the state of the art is to try to compensate the ampere-turns generated between different conductors forming adjacent coils of the transformer by means of shrewd geometrical arrangements.

Among the known techniques, Litz wires can be cited, which are manufactured by weaving strands that are electrically insulated from one another, whose diameter is less than the value of the skin thickness at the switching frequency. Since each unitary strand is alternately on the inside then on the outside of the wire, the magnetic field that it creates is compensated with that of the other strands.

It is also possible to interleave the different coils of a transformer to progressively neutralize the magnetic field created by each coil.

These solutions, despite an inevitable surfeit for the first (the effective section of a Litz wire is that much less than that of a "solid" conductor of equivalent outer diameter as the unitary strands are fine) and of stray capacitance for the second, prove relatively effective for attenuating the skin and proximity effects in the windings of the transformer. However, these benefits disappear outside the windings, when connections have to be created. The losses due to the high frequencies in the connections between the windings and the components linked to the transformer are then significant, and the overall efficiency of the transformer and of the switched-mode power supply is thereby significantly reduced. This phenomenon also partly explains the differences in efficiency observed between theoretical calculations and experimental measurements, the experimental locating of these losses being very difficult to perform reliably and accurately.

OBJECT OF THE INVENTION

The object of the invention is to increase the efficiency of a transformation device comprising a transformer and electrical components linked to the transformer, without however increasing the volume of the transformation device.

SUMMARY OF THE INVENTION

In order to realize this aim, a transformation device is proposed comprising a transformer, first electrical components and connection means, the transformer comprising a first winding and a second winding, one of the first winding and second winding forming at least one primary coil and the other of the first winding and second winding forming a secondary coil, the first electrical components being connected via the connection means between first terminals of the first winding, the first electrical components extending over an integration surface situated between the connection means, the integration surface, the connection means and a portion of the first winding forming portions of circulation of a first current circulation loop, the transformation device being arranged for a connection current to circulate in the first current circulation loop, each portion of circulation being wider than it is long in a line of circulation of the connection current.

By implementing the first current circulation loop which is wider than it is long, the losses associated with the circulation of the connection current in the first electrical components and in the connection means which link the first electrical components to the first winding are reduced. The losses are therefore reduced in areas in which the reduction techniques described earlier are not applicable. The efficiency of the transformation device according to the invention is thus significantly increased.

Also proposed is a switched-mode power supply comprising a transformation device such as that which has just been described.

Also proposed is electrical equipment comprising a housing in which the switched-mode power supply is incorporated.

Other features and advantages of the invention will emerge on reading the following description of a nonlimiting particular embodiment of the invention.

BRIEF DESCRIPTION OF THE DRAWINGS

Reference will be made to the attached drawings, in which.

DETAILED DESCRIPTION OF THE INVENTION

The transformation device according to the invention is used here in a switched-mode power supply forming a DC/DC converter.

Figure 1:
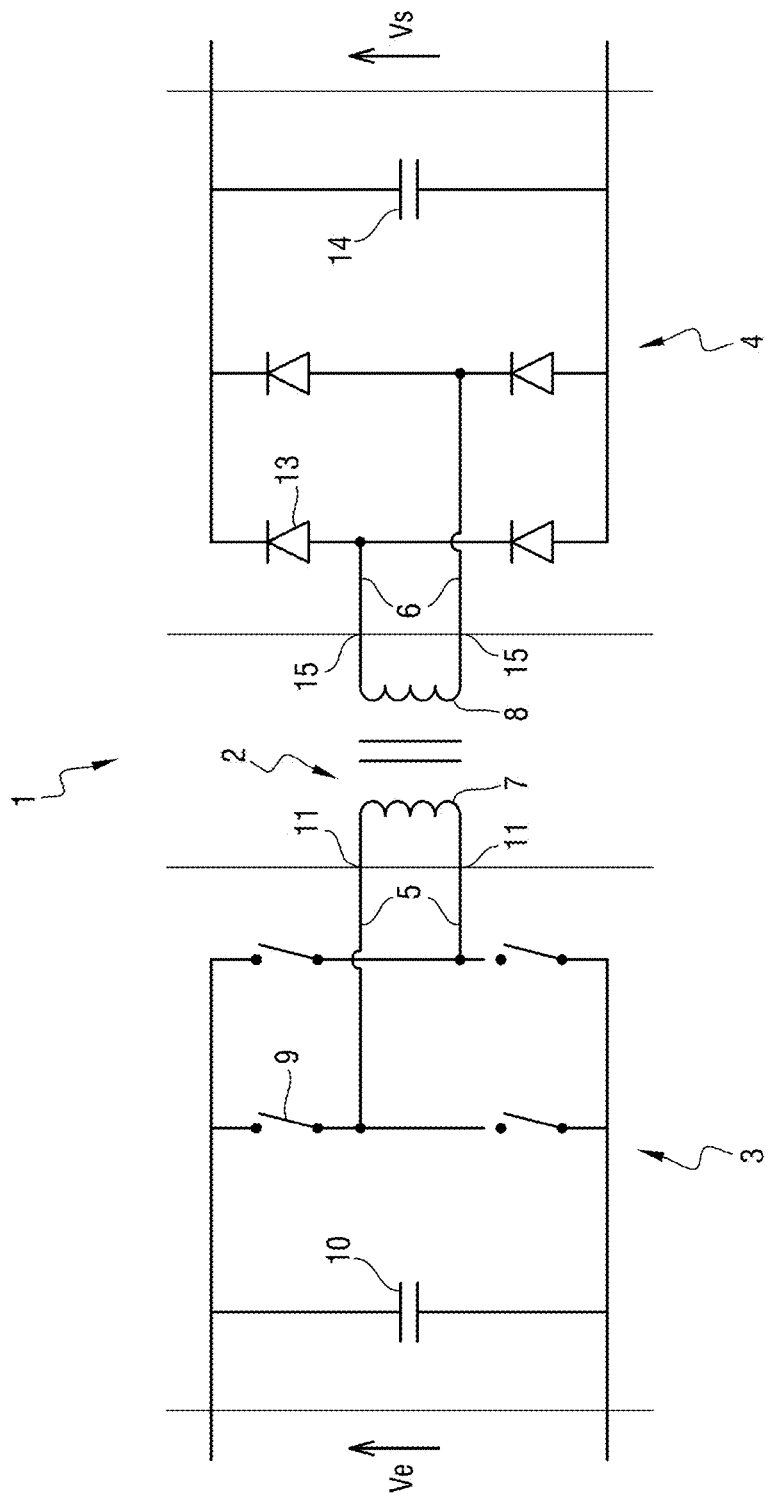
FIG. 1 represents a simplified electrical circuit diagram of a switched-mode power supply incorporating the transformation device according to the invention.

Referring to FIG. 1, the transformation device 1 comprises a transformer 2, primary electrical components 3, secondary electrical components 4, primary connection means 5 and secondary connection means 6.

The transformer 2 comprises a primary winding forming at least one primary coil 7 and a secondary winding forming at least one secondary coil 8.

"Winding" is understood here to mean one or more conductor(s) of any type wound to form an electrical circuit. Each conductor can be an electrical wire, a bar, a leaf, a track etched on a printed circuit, etc.

Although a single primary coil 7 and a single secondary coil 8 are represented in FIG. 1, the primary winding of the transformer 2 here comprises five primary coils 7 and the secondary winding here comprises five secondary coils 8. A secondary current, circulating in the secondary winding, is, here, five times greater than a primary current circulating in the primary coil.

The primary electrical components 3 comprise a plurality of transistors 9 and a primary filtering capacitor 10. "Filtering capacitor" is understood here to mean any capacitor performing any type of filtering. A "filtering capacitor" can for example be a decoupling capacitor. The primary electrical components 3 are connected between primary terminals 11 of the primary winding via the primary connection means 5.

The secondary electrical components 4 comprise diodes 13 and a secondary filtering capacitor 14. The secondary electrical components 4 are connected between secondary terminals 15 of the secondary winding via the secondary connection means 6.

Conventionally and as is well known, a direct input voltage Ve is switched (or chopped) by the transistors 9 and applied between the primary terminals 11. A direct output voltage Vs is then produced after rectification and filtering.

Obviously, the diagram of FIG. 1 and the operation described are extremely simplified compared to the real diagram and operation of the switched-mode power supply.

Figure 2:
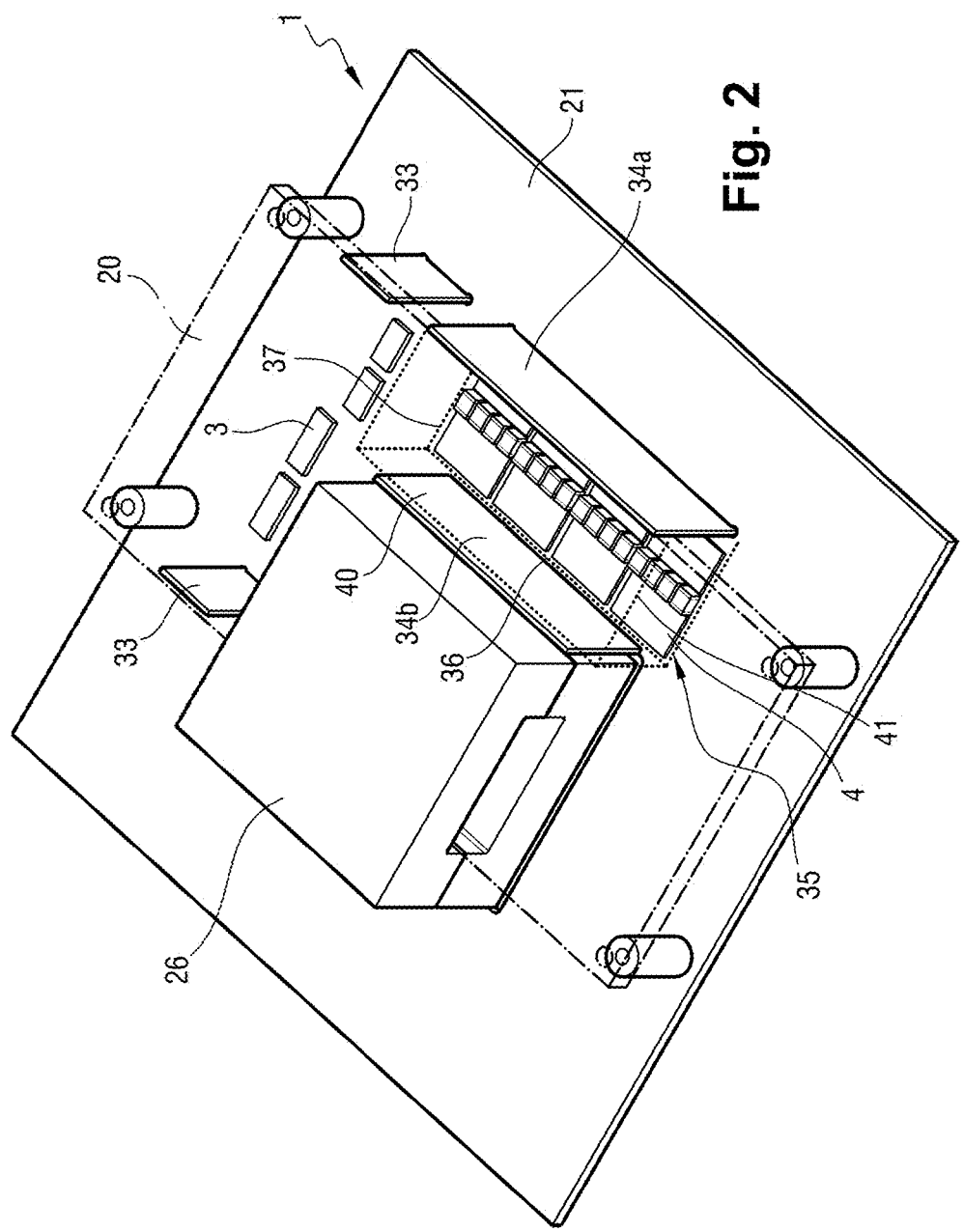
FIG. 2 is a perspective view from above of the transformation device, a first printed circuit being represented partially transparent.
Figure 3:
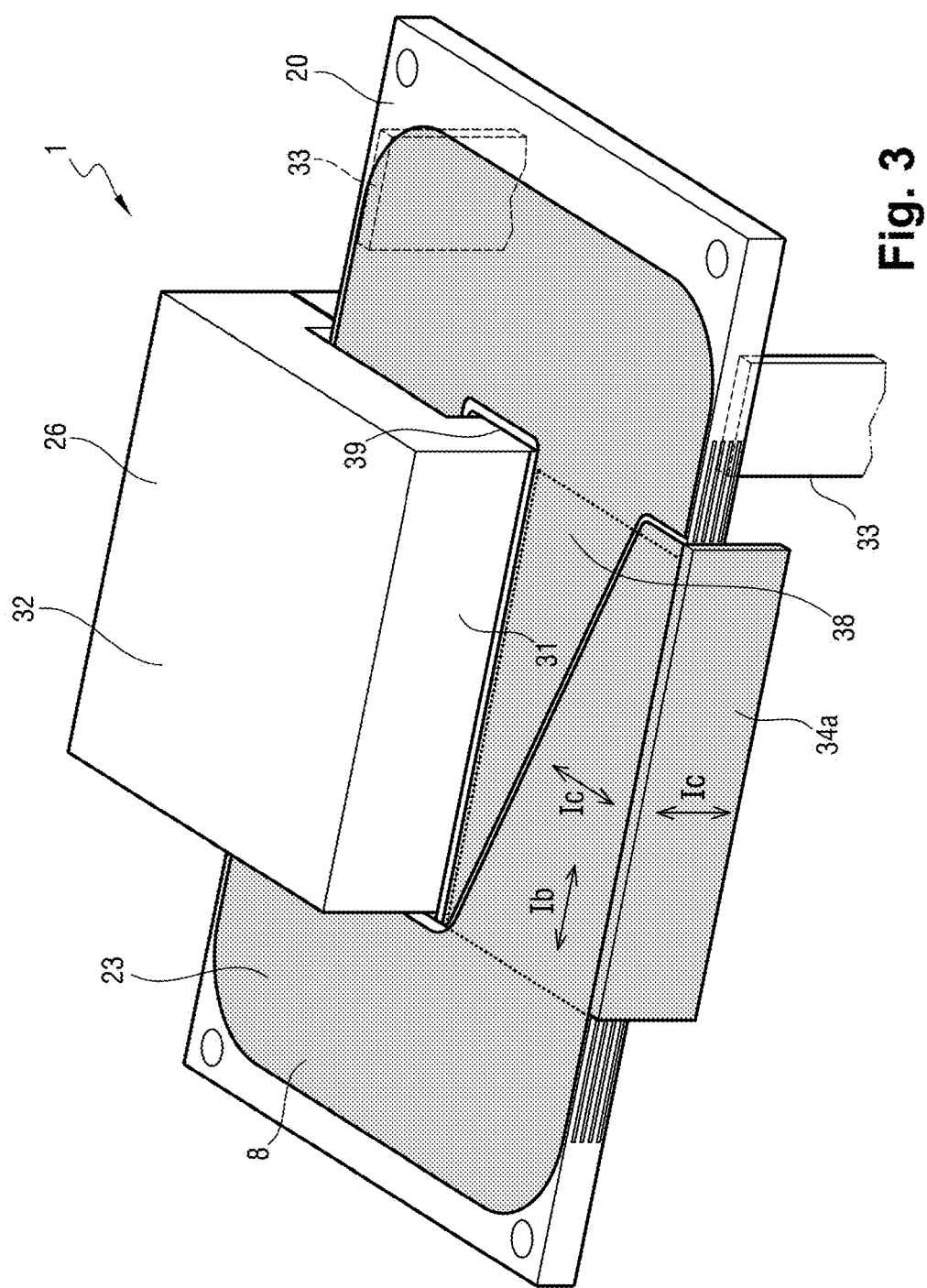
FIG. 3 is a perspective view from above of the first printed circuit and of a magnetic circuit of the transformation device.
Figure 4:
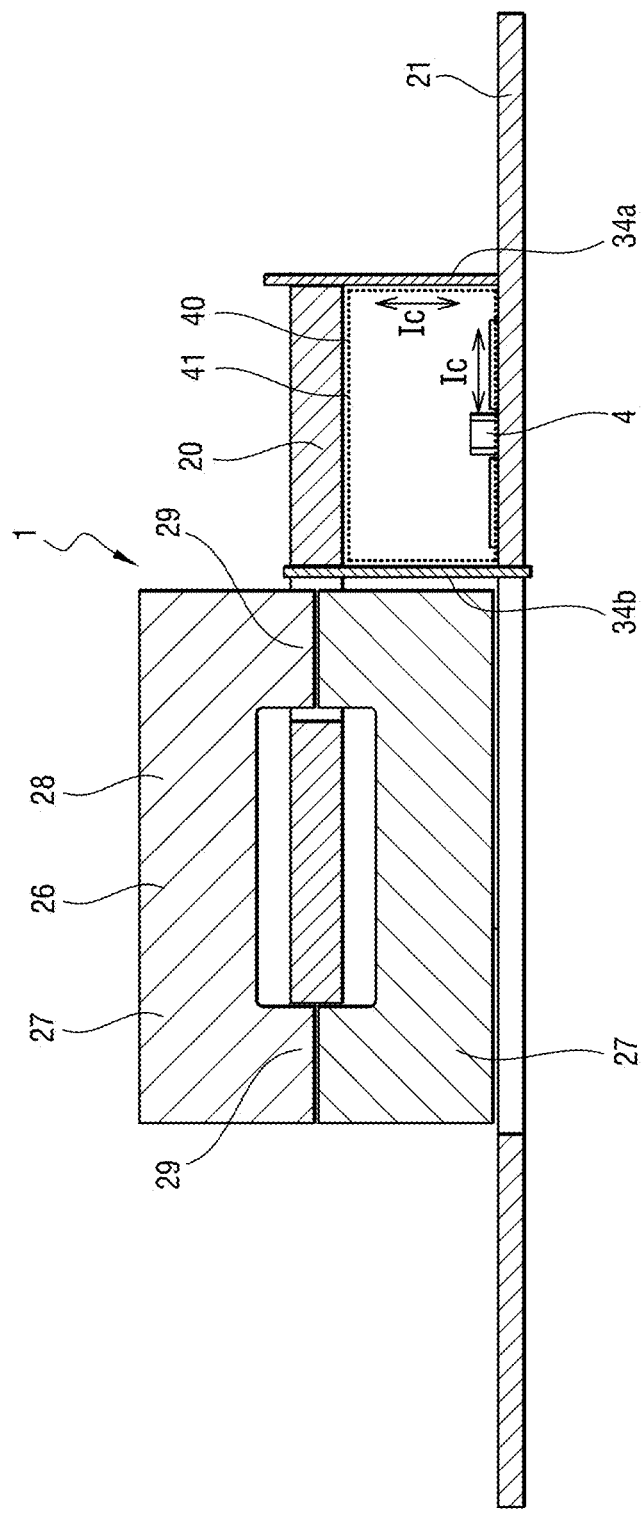
FIG. 4 is a sectional view of the transformation device.

Referring to FIGS. 2 to 4, the transformation device according to the invention 1 is here produced on a first printed circuit 20 and on a second printed circuit 21.

The transformer 2 is, here, of the "planar" type.

The primary winding and the secondary winding of the transformer 2 comprise tracks 23 forming turns etched on different layers of the first printed circuit 20.

The first printed circuit 20 comprises ten layers comprising five primary layers and five secondary layers. A primary coil 7 is formed on each primary layer. A secondary coil 8 is formed on each secondary layer. The five primary layers and the five secondary layers are superposed alternately: a primary layer is positioned between two secondary layers, and a secondary layer is positioned between two primary layers (except for the top layer and the bottom layer).

The primary layers are connected to one another in series or in parallel, so as to form the primary coils 7 according to the desired transformation ratio. Likewise, the secondary layers are connected to one another in series or in parallel to form the secondary coils 8.

The transformer 2 also comprises a magnetic circuit, in this case a ferrite core 26, inside which the primary winding and the secondary winding at least partially extend.

The ferrite core 26 comprises two identical core portions 27. Each core portion 27 comprises a base 28 and two branches 29 which extend at right angles to the base 28, each core portion 27 thus having a C-shaped section. The two core portions 27 are positioned one against the other but in reverse direction, such that the surface of the free end of each branch 29 of a core portion 27 bears against the surface of the free end of a branch 29 of the other core portion 27. The ferrite core 26, when it is assembled, takes the form of a tube of rectangular outer and inner sections, the thickness of the walls of the tube being close to the dimension of a small side of the inner section. Note that it would be possible to form an air gap in the magnetic circuit, for example by inserting an air gap shim between the two core portions 27.

The first printed circuit 20 comprises an orifice 39 positioned in a central portion of the first printed circuit 20. The primary coils 7 and the secondary coils 8 extend around the orifice 39, as can be seen in FIG. 3, in which a "top" secondary coil 8 is represented.

The ferrite core 26 is positioned relative to the first printed circuit 20 so that a lateral wall 31 of the ferrite core 26 extends in the orifice 39 orthogonally to the first printed circuit 20, that the other lateral wall extends on the outside of the first printed circuit 20, and that the top wall 32 and the bottom wall of the ferrite core 26 each extend on one side of the first printed circuit 20 parallel thereto. The joining zone between the two core portions 27 of the ferrite core 26 is, here, at the middle of a thickness of the first printed circuit 20.

The first printed circuit 20 and the second printed circuit 21 are mounted parallel to one another and are fixed to one another using conventional fixing means: blocks, spacers, bolts, screws, etc.

The primary electrical components 3 and the secondary electrical components 4 are, here, mounted on the second printed circuit 21.

The primary connection means 5, via which the primary electrical components 3 are connected to the primary terminals 11, comprise two primary conductive tabs 33 which extend vertically between the first printed circuit 20 and the second printed circuit 21.

The two primary conductive tabs 33 both have a rectangular form. The current circulates in the primary conductive tabs 33 in a vertical line, that is to say at right angles to the first printed circuit 20 and to the second printed circuit 21. In this description the "length" and the "width" of a surface are distinguished as follows: the length corresponds to the dimension of the surface in a line parallel to the current which passes through said surface, and the width corresponds to the dimension of the surface in a line at right angles to the current which passes through said surface.

The primary conductive tabs 33 are, here, longer than they are wide.

The primary components 3 are positioned on a surface of the second printed circuit 21 which extends between the primary conductive tabs 33.

The secondary connection means 6, via which the secondary electrical components 4 are connected to the secondary terminals 15, comprise two secondary conductive tabs 34 which extend vertically between the first printed circuit 20 and the second printed circuit 21.

The two secondary conductive tabs 34 both have a rectangular form. The current circulates in the secondary conductive tabs 34 in a vertical line, that is to say at right angles to the first printed circuit 20 and to the second printed circuit 21.

The secondary conductive tabs 34 are, here, wider than they are long.

The secondary electrical components 4 are situated in an integration zone having a volume delimited in length and in width by a length and a width of a winding assembly formed by the primary winding and the secondary winding, and in height by a height of the magnetic circuit 26.

The secondary electrical components 4 extend here over an integration surface 35 of the second printed circuit 21. The integration surface 35 is situated between the secondary conductive tabs 34. The integration surface 35 has a generally rectangular form and is delimited by first sides 36 parallel to the segments constituting the intersections of the secondary conductive tabs 34 and of the second printed circuit 21, and by second sides 37 at right angles to the first sides 36.

The dimension of the first sides 36 is greater than that of the second sides 37.

There now follows a more detailed description of the circulation of the currents in the secondary winding, in the secondary conductive tabs 34 and in the secondary electrical components 4. These currents are high-frequency currents.

The secondary current which circulates in the secondary winding is in reality formed by the sum of a plurality of currents which each circulate in distinct lines. Among these currents, a winding current Ib and a connection current Ic are distinguished.

The winding current Ib circulates in the secondary winding in a line locally parallel to the turns forming the secondary winding.

The connection current Ic is the current which circulates in the secondary electrical components 4 and in the secondary conductive tabs 34.

A line of circulation of the winding current Ib is orthogonal to a line of circulation of the connection current Ic. More specifically, a main component of the winding current Ic is locally orthogonal, at least in a zone situated in proximity to the joins between the secondary conductive tabs 34 and the secondary winding, to a main component of the connection current Ic. Note that the term "line" of circulation and not "direction" of circulation is used, because the currents are alternating currents whose direction is reversed regularly at the frequency of said currents.

The connection current Ic therefore circulates in the integration surface 35 parallel to the second sides 37 of the integration surface 35, in a first secondary conductive tab 34a parallel to the length of the first secondary conductive tab 34a, in the secondary components 4, in a portion 38 of the secondary winding, and in a second secondary conductive tab 34b parallel to the length of the second secondary conductive tab 34b.

The connection current Ic thus circulates in a current circulation loop 40 formed by a plurality of portions of circulation. The portions of circulation comprise the first secondary conductive tab 34a, the second secondary conductive tab 34b, the portion 38 of the secondary winding and the integration surface 35.

The current circulation loop 40 has a cylindrical form, whose section in a plane at right angles to a longitudinal axis of the cylindrical form is a rectangle of circulation 41. It is also possible to consider that the current circulation loop 40 has a parallelepipedal form: its surface is that of a parallelepiped from which two opposing faces (the two faces delimited by the rectangle of circulation 41 and which are at right angles to both the secondary conductive tabs 34 and the first printed circuit 20) would have been eliminated.

The faces of the cylindrical form are formed by the portions of circulation of the current circulation loop 40.

The rectangle of circulation 41 extends in a thickness of the first printed circuit 20, of the second printed circuit 21 and of the secondary conductive tabs 34. The two large sides of the rectangle of circulation 41 have for their dimension that of the length of the integration surface 35 (that is to say of a second side 37), and the two small sides of the rectangle of circulation 41 have for their dimension that of the length of the secondary conductive tabs 34 (or that of the distance between the first printed circuit 20 and the second printed circuit 21).

The perimeter P of the rectangle of circulation 41 is such that:

$$P \leq 1.6 \cdot L,$$

in which L is the width of the secondary conductive tabs 34.

The width of the secondary conductive tabs 34 is therefore relatively great compared to the perimeter P of the rectangle of circulation 41.

As was seen earlier, the dimension of the first sides 36 of the integration surface 35 is greater than that of the second sides 37: the integration surface 35 is wider than it is long.

Likewise, the length of the secondary conductive tabs 34 is clearly less than their width.

Thus, the length of each portion of circulation of the current circulation loop 40 is less than the width of said portion of circulation.

This configuration is particularly advantageous. By minimizing the total length of the current circulation loop 40, and by increasing the ratio between the width and the length of said current circulation loop 40, the resistance is significantly reduced in the secondary connection means 6 (that is to say in the secondary conductive tabs 34), and in the electrical components situated in proximity and linked to the secondary winding, that is to say in the secondary electrical components 4.

By reducing this resistance, the losses due to the high-frequency currents are reduced in the zones which have just been described, outside of the secondary coil, in which loss reduction techniques of the prior art cannot be implemented. The efficiency of the transformation device according to the invention is thus greatly increased.

Obviously, the invention is not limited to the embodiment described but encompasses any variant falling within the scope of the invention as defined by the claims.

It has been described here that the integration surface, on which the secondary electrical components are mounted, is situated on the second printed circuit. The integration surface could perfectly well be situated on the first printed circuit, so that the primary winding, the secondary winding and the integration surface were positioned on the same first printed circuit. The primary winding and the secondary winding could also be only partially formed on the first printed circuit.

The invention is, here, implemented with first electrical components, in this case the secondary electrical components, and a first winding, in this case the secondary winding. It would also be possible to implement the invention with the primary electrical components and the primary winding: the first electrical components are then the primary electrical components and the first winding is the primary winding.

Advantageously, the invention can be implemented both with the primary electrical components and the primary winding, and with the secondary electrical components and the secondary winding. There are then defined, on the one hand, the first electrical components, the first winding, and a first current circulation loop, and, on the other hand, second electrical components connected between second terminals of a second winding, and a second current circulation loop similar to the first current circulation loop. The second current circulation loop is thus formed by a second integration surface, second connection means and a portion of the second winding, each portion of circulation of the second current circulation loop being wider than it is long.

The transformer described here is a planar transformer comprising windings comprising turns formed on a printed circuit. The transformer can of course be different. The windings of the transformer can for example be formed by wound conductive wires. The transformer could also comprise a first winding (primary or secondary) comprising turns formed on a printed circuit, and a second winding formed by wound conductive wire(s). The transformer would thus partially be formed on a printed circuit.

In this description, electrical components other than the primary electrical components and the secondary electrical components mounted on the first printed circuit and/or on the second printed circuit have not been discussed. It is of course possible for other components to be situated on the first printed circuit and/or on the second printed circuit and it is also possible for this not to be the case. The transformation device can thus be incorporated on one or more electrical equipment printed circuits which are not only dedicated to this function, or else can be incorporated on one or more printed circuits dedicated to this function. In the latter case, it is perfectly possible to provide for the transformation device to take the form of a single integrated component each integrated component copy then optionally being able to be associated with a single serial number and a single part number.

The magnetic circuit can obviously be different from that presented here. It can, for example, be a core of any material comprising two core portions each having E-shaped section.

The invention claimed is:

1. A transformation device comprising a transformer, first electrical components and connection means, the transformer comprising a first winding and a second winding, one of the first winding and second winding forming at least one primary coil and the other of the first winding and second winding forming at least one secondary coil, the first electrical components being connected via the connection means between first terminals of the first winding, the first electrical components extending over an integration surface situated between the connection means, the integration surface, the connection means and a portion of the first winding forming portions of circulation of a first current circulation loop, the transformation device being arranged for a connection current to circulate in the first current circulation loop, each portion of circulation being wider than it is long in a line of circulation of the connection current.

2. The transformation device according to claim 1, a winding current circulating in the first winding, the first winding and the connection means being arranged in such a way that a line of circulation of the winding current is orthogonal to the line of circulation of the connection current.

3. The transformation device according to claim 1, the transformer comprising a magnetic circuit inside which the first winding and the second winding at least partially extend, the integration surface being situated in an integration zone having a volume delimited in length and in width by a length and a width of a winding assembly formed by the first winding and the second winding, and in height by a height of the magnetic circuit.

4. The transformation device according to claim 1, in which the first winding and the second winding are at least partially formed on a printed circuit, and in which the integration surface is situated on said printed circuit.

5. The transformation device according to claim 1, in which the first winding and the second winding are at least partially formed on a first printed circuit, and in which the integration surface is situated on a second printed circuit parallel to the first printed circuit.

6. The transformation device according to claim 5, in which the connection means comprise two conductive tabs, linking the first printed circuit and the second printed circuit, the integration surface extending between the two conductive tabs, a section of the first current circulation loop being a rectangle of circulation which extends in a thickness of the first printed circuit, of the second printed circuit and of the conductive tabs.

7. The transformation device according to claim 6, in which a perimeter P of the rectangle of circulation is such that:

$$P \leq 1.6 \cdot L$$

L being a width of the conductive tabs.

8. The transformation device according to claim 1, further comprising second electrical components connected between second terminals of the second winding, the transformation device comprising a second current circulation loop similar to the first current circulation loop.

9. The transformation device according to claim 1, the first winding forming at least one secondary coil, the first electrical components comprising rectifying diodes and a filtering capacitor belonging, just like the transformer, to a switched-mode power supply.

10. A switched-mode power supply comprising the transformation device according to claim 9.

11. An electrical equipment comprising a housing in which is incorporated the switched-mode power supply according to claim 10.

12. The transformation device according to claim 1, the first winding forming at least one primary coil, the first electrical components comprising switching transistors and a filtering capacitor belonging, just like the transformer, to a switched-mode power supply.

\* \* \* \* \*